US010607666B2

(12) United States Patent
Hong

(10) Patent No.: US 10,607,666 B2
(45) Date of Patent: Mar. 31, 2020

(54) DATA TRANSFER DEVICE AND SEMICONDUCTOR DEVICE INCLUDING THE DATA TRANSFER DEVICE

(71) Applicant: SK hynix Inc., Icheon-si, Gyeonggi-do (KR)

(72) Inventor: Yun Seok Hong, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/122,457

(22) Filed: Sep. 5, 2018

(65) Prior Publication Data

US 2019/0295612 A1 Sep. 26, 2019

(30) Foreign Application Priority Data

Mar. 23, 2018 (KR) .................. 10-2018-0033878

(51) Int. Cl.
*G11C 7/10* (2006.01)
*G11C 7/06* (2006.01)
*G11C 5/14* (2006.01)

(52) U.S. Cl.
CPC ............ *G11C 7/1048* (2013.01); *G11C 7/06* (2013.01); *G11C 7/1096* (2013.01); *G11C 5/147* (2013.01)

(58) Field of Classification Search
CPC ............... G09G 3/3607; G09G 3/3648; G09G 2320/066; G09G 2320/0233; G09G 2300/0804; G09G 2310/06; G09G 2320/0242; G09G 2310/0251; G09G 2320/028; G09G 2300/0447; G11C 7/1048; G11C 7/1096; G11C 7/06; G11C 5/147; G11C 7/1057
USPC ....................................... 365/189.17
See application file for complete search history.

(56) References Cited

U.S. PATENT DOCUMENTS 6,920,068 B2 * 7/2005 Ku ................. G11C 7/1006
365/189.02
7,206,213 B2 * 4/2007 Kim ................. G11C 7/1048
365/189.05
8,953,400 B2 2/2015 Lee
9,025,395 B2 5/2015 Lee

* cited by examiner

*Primary Examiner* — Tha-O H Bui
(74) *Attorney, Agent, or Firm* — William Park & Associates Ltd.

(57) ABSTRACT

A data transfer device may include: a global input/output (GIO) driver configured for driving input data and outputting the driven data to a first GIO line, and configured for using a second supply voltage lower than a first supply voltage as a source voltage to drive the input data; and a repeater configured for amplifying data applied to the first GIO line, outputting the amplified data to a second GIO line, and shifting the data applied to the first GIO line to a level of the first supply voltage. The repeater may drive the data applied to the first GIO line to a first node, drive an output of the first node to the second GIO line, and reset the first node to the level of the first supply voltage based on a reset signal before a read operation.

20 Claims, 5 Drawing Sheets

DATA TRANSFER DEVICE AND SEMICONDUCTOR DEVICE INCLUDING THE DATA TRANSFER DEVICE

CROSS-REFERENCES TO RELATED APPLICATION

The present application claims priority under 35 U.S.C. § 119(a) to Korean application number 10-2018-0033878, filed on Mar. 23, 2018, in the Korean Intellectual Property Office, which is incorporated herein by reference in its entirety.

BACKGROUND

1. Technical Field

Various embodiments generally relate to a data transfer device and a semiconductor device including the data transfer device, and more particularly, to a technology that may be capable of reducing power consumption when data is transferred.

2. Related Art

With the technology development of the computer system or electronic communication field, semiconductor devices included in electronic devices have been gradually reduced in price and size, but have increased in capacity. Furthermore, with the increasing demand for energy efficiency by consumers, semiconductor devices are designed to suppress unnecessary current consumption.

For example, a semiconductor device includes a plurality of input/output lines for transferring data. The size reduction and capacity increase of the semiconductor device inevitably raise the line loadings of the input/output lines. The input/output lines are divided into a segment input/output line, a local input/output line, a global input/output line, and the like, depending on the arrangement positions thereof.

With the gradual increase in capacity of the semiconductor device, the lengths of the input/output lines are also increased. The increase in lengths of the input/output lines indicates that the loadings of the lines rise as much.

In particular, since the global input/output line has a relatively large length, the global input/output line inevitably has large loading. Thus, data may be distorted or lost through the global input/output line, while power consumption is increased. Therefore, there is a demand for a technique for minimizing current consumption while minimizing distortion and loss of data.

SUMMARY

In an embodiment, a data transfer device may include: a global input/output (GIO) driver configured for driving input data and outputting the driven data to a first GIO line, and configured for using a second supply voltage lower than a first supply voltage as a source voltage to drive the input data; and a repeater configured for amplifying data applied to the first GIO line, outputting the amplified data to a second GIO line, and shifting the data applied to the first GIO line to a level of the first supply voltage. The repeater may drive the data applied to the first GIO line to a first node, drive an output of the first node to the second GIO line, and reset the first node to the level of the first supply voltage based on a reset signal before a read operation.

In an embodiment, a semiconductor device may include: an input/output sense amplifier configured for sensing and amplifying data of a local input/output line during a read operation; and a data transfer device configured for driving a second global input/output (GIO) line to a level corresponding to an output signal of the input/output sense amplifier during the read operation. The data transfer device may include: a GIO driver configured for driving input data using a second supply voltage lower than a first supply voltage as a source voltage, and outputting the driven data to a first GIO line; and a repeater configured for shifting data applied to the first GIO line to a level of the first supply voltage level. The repeater may drive the data applied to the first GIO line to a first node, drive an output of the first node to the second GIO line, and reset the first node to the level of the first supply voltage based on a reset signal before a read operation.

DETAILED DESCRIPTION

Hereinafter, examples of embodiments will be described below with reference to the accompanying drawings.

Various embodiments are directed to a semiconductor device that may be capable of reducing current consumption during data transfer by improving the structure of a data transfer circuit.

Figure 1:
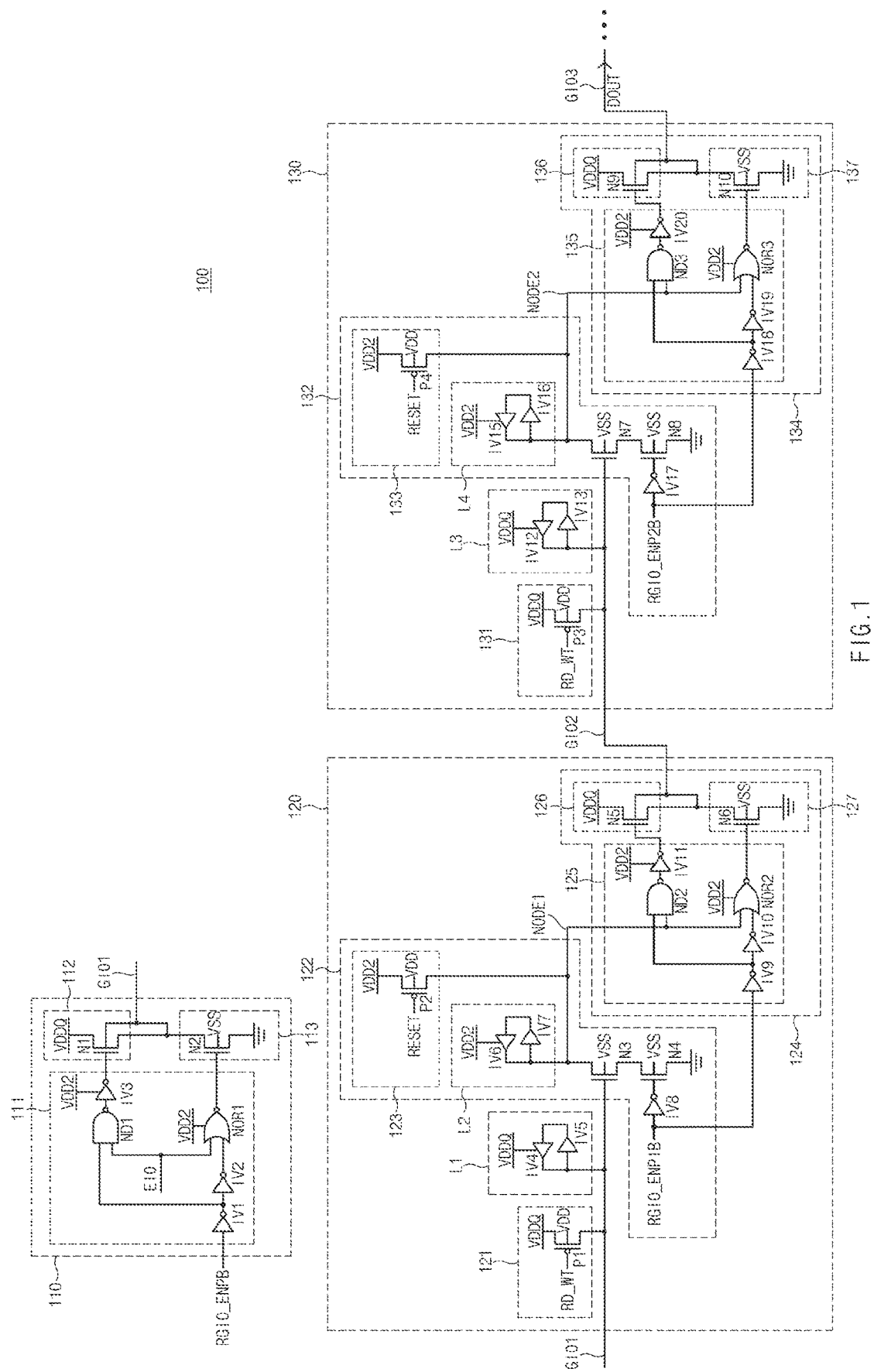
FIG. 1 is a circuit diagram of a data transfer device in accordance with an embodiment.

FIG. 1 is a circuit diagram of a data transfer device in accordance with an embodiment.

The data transfer device 100 in accordance with an embodiment may include a global input/output (GIO) driver 110 and a plurality of repeaters 120 and 130.

The GIO driver 110 may drive input data EIO in response to an enable signal RGIO_ENPB, and output the driven data to a GIO line GIO1. The GIO driver 110 may include a data input unit 111, a pull-up driving unit 112, and a pull-down driving unit 113.

The data input unit 111 may perform a logical operation on the enable signal RGIO_ENPB and the input data EIO, and output the operation result. The data input unit 111 may include a plurality of inverters IV1 to IV3, a NAND gate ND1, and a NOR gate NOR1. The data input unit 111 may use a first supply voltage VDD2 having a high voltage level as a source voltage. Therefore, the data input unit 111 may supply a signal having the first supply voltage level VDD2 to the pull-up driving unit 112 and the pull-down driving unit 113.

The NAND gate ND1 may perform a NAND operation on the input data EIO and the enable signal RGIO_ENPB inverted by the inverter IV1. The inverter IV2 may invert an output of the inverter IV1. The inverter IV3 may invert an output of the NAND gate ND1, and output the inverted signal to the pull-up driving unit 112. The NOR gate NOR1 may perform a NOR operation on the input data EIO and an output of the inverter IV2.

The pull-up driving unit 112 may include an n-channel metal-oxide semiconductor (NMOS) transistor N1 for pulling up the GIO line GIO1 to a second supply voltage level VDDQ in response to the output of the inverter IV3. The NMOS transistor N1 may be coupled between a second supply voltage terminal VDDQ and the GIO line GIO1, and receive the output of the inverter IV3 through a gate terminal thereof. The NMOS transistor N1 may have a bulk terminal coupled to the GIO line GIO1.

The pull-down driving unit 113 may include an NMOS transistor N2 for pulling down the GIO line GIO1 to a ground voltage level in response to the output of the NOR gate NOR1. The NMOS transistor N2 may be coupled between the GIO line GIO1 and a ground voltage terminal, and receive the output of the NOR gate NOR1 through a gate terminal thereof. The NMOS transistor N2 may receive the ground voltage VSS through a bulk terminal thereof.

The repeater 120 may reduce data distortion by amplifying the voltage level of the GIO line GIO1 through which the data are transferred, thereby compensating for output attenuation. Since a data line such as the GIO line GIO1 has relatively large loading, data distortion or loss may occur. For this operation, the repeater 120 may be inserted in the middle of the GIO lines GIO1 to GIO3, in order to reduce data distortion.

The repeater 120 may include a pull-up driving unit 121, a latch unit L1, a data driving unit 122, and an output driving unit 124.

The pull-up driving unit 121 may pull up the GIO line GIO1 to the second supply voltage level VDDQ in response to a control signal RD_WT. The pull-up driving unit 121 may include a p-channel metal oxide semiconductor (PMOS) transistor P1 which is coupled between the second supply voltage terminal VDDQ and the GIO line GIO1, and receive the control signal RD_WT through a gate terminal thereof. The control signal RD_WT may be activated during a data read or write operation. The PMOS transistor P1 may receive a power supply voltage VDD through a bulk terminal thereof.

The latch unit L1 may latch data applied to the GIO line GIO1 for a predetermined time. The latch unit L1 may use the second supply voltage VDDQ as a source voltage. The latch unit L1 may include inverters IV4 and IV5 having input/output terminals coupled to each other in a latch structure.

The data driving unit 122 may drive and level-shift the data applied to the GIO line GIO1, and output the shifted data to the output driving unit 124. The data driving unit 122 may include NMOS transistors (pull-down driving elements) N3 and N4, an inverter IV8, a latch unit L2, and a reset unit 123.

The NMOS transistors N3 and N4 may be coupled in series between a node NODE1 (e.g., a first node) and the ground voltage terminal. The NMOS transistor N3 may have a gate terminal coupled to the GIO line GIO1. The NMOS transistor N4 may receive an enable signal RGIO_ENP1B inverted by the inverter IV8 through a gate terminal thereof. The NMOS transistor N4 may be implemented with a MOS transistor having a low threshold voltage. The NMOS transistors N3 and N4 may each receive the ground voltage VSS through a bulk terminal thereof.

The latch unit L2 may latch data applied to the node NODE1 for a predetermined time. The latch unit L2 may use the first supply voltage VDD2 as a source voltage. The latch unit L2 may include inverters IV6 and IV7 having input/output terminals coupled to each other in a latch structure.

The reset unit 123 may reset the node NODE1 to the first supply voltage level VDD2 in response to a reset signal RESET. The reset signal RESET may be applied to reset data applied to the node NODE1 during operations other than a read or write operation. For example, the reset signal RESET may be deactivated to a logic high level during the read or write operation, and activated to a logic low level during the other operations. The reset unit 123 may include a PMOS transistor (pull-up driving element) P2 which is coupled between the first supply voltage terminal VDD2 and the node NODE1, and receives the reset signal RESET through a gate terminal thereof. The PMOS transistor P2 may receive a power supply voltage VDD through a bulk terminal thereof.

The output driving unit 124 may drive the output of the node NODE1 and output the driven signal (i.e., the driven output of the node NODE1) to a GIO line GIO2, in response to the enable signal RGIO_ENP1B. The output driving unit 124 may include a data input unit 125, a pull-up driving unit 126, and a pull-down driving unit 127.

The data input unit 125 may perform a logical operation on the enable signal RGIO_ENP1B and the output of the node NODE1, and output the operation result. The data input unit 125 may include a plurality of inverters IV9 to IV11, a NAND gate ND2, and a NOR gate NOR2. The data input unit 125 may use the first supply voltage VDD2 having a high voltage level as a source voltage. Therefore, the data input unit 125 may supply a signal having the first supply voltage level VDD2 to the pull-up driving unit 126 and the pull-down driving unit 127.

The NAND gate ND2 may perform a NAND operation on the output of the node NODE1 and the enable signal RGIO_ENP1B inverted by the inverter IV9. The inverter IV10 may invert the output of the inverter IV9. The inverter IV11 may invert an output of the NAND gate ND2, and output the inverted signal to the pull-up driving unit 126. The NOR gate NOR2 may perform a NOR operation on the output of the node NODE1 and an output of the inverter IV10.

The pull-up driving unit 126 may include an NMOS transistor N5 for pulling up the GIO line GIO2 to the second supply voltage level VDDQ in response to the output of the inverter IV11. The NMOS transistor N5 may be coupled between the second supply voltage terminal VDDQ and the GIO line GIO2, and receive the output of the inverter IV11 through a gate terminal thereof. The NMOS transistor N5 may have a bulk terminal coupled to the GIO line GIO2.

The pull-down driving unit 127 may include an NMOS transistor N6 for pulling down the GIO line GIO2 to the ground voltage level in response to the output of the NOR gate NOR2. The NMOS transistor N6 may be coupled between the GIO line GIO2 and the ground voltage terminal, and receive the output of the NOR gate NOR2 through a gate terminal thereof. The NMOS transistor N6 may receive the ground voltage VSS through a bulk terminal thereof.

The repeater 130 may reduce data distortion by amplifying the voltage level of the GIO line GIO2 through which the data are transferred, thereby compensating for output attenuation. The repeater 130 may include a pull-up driving unit 131, a latch unit L3, a data driving unit 132 and an output driving unit 134.

The pull-up driving unit 131 may pull up the GIO line GIO2 to the second supply voltage level VDDQ in response to the control signal RD_WT. The pull-up driving unit 131 may include a PMOS transistor P3 which is coupled between the second supply voltage terminal VDDQ and the GIO line GIO2, and receives the control signal RD_WT through a gate terminal thereof. The PMOS transistor P3 may receive a power supply voltage VDD through a bulk terminal thereof.

The latch unit L3 may latch data applied to the GIO line GIO2 for a predetermined time. The latch unit L3 may use the second supply voltage VDDQ as a source voltage. The latch unit L3 may include inverters IV12 and IV13 having input/output terminals coupled to each other in a latch structure.

The data driving unit 132 may drive and level-shift the data applied to the GIO line GIO2, and output the shifted data to the output driving unit 134. The data driving unit 132 may include NMOS transistors (pull-down driving elements) N7 and N8, an inverter IV17, a latch unit L4, and a reset unit 133.

The NMOS transistors N7 and N8 may be coupled in series between a node NODE2 (e.g., a second node) and the ground voltage terminal. The NMOS transistor N7 may have a gate terminal coupled to the GIO line G1O2. The NMOS transistor N8 may receive an enable signal RGIO_ENP2B inverted by the inverter IV17 through a gate terminal thereof. The NMOS transistor N8 may be implemented with a MOS transistor having a low threshold voltage. The NMOS transistors N7 and N8 may each receive the ground voltage VSS through a bulk terminal thereof.

The latch unit L4 may latch data applied to the node NODE2 for a predetermined time. The latch unit L4 may use the first supply voltage VDD2 as a source voltage. The latch unit L4 may include inverters IV15 and IV16 having input/output terminals coupled to each other in a latch structure.

The reset unit 133 may reset the node NODE2 to the first supply voltage level VDD2 in response to the reset signal RESET. The reset unit 133 may include a PMOS transistor (pull-up driving element) P4 which is coupled between the first supply voltage terminal VDD2 and the node NODE2, and receives the reset signal RESET through a gate terminal thereof. The PMOS transistor P4 may receive a power supply voltage VDD through a bulk terminal thereof.

The output driving unit 134 may drive the output of the node NODE2 and output the driven signal to a GIO line G103, in response to the enable signal RGIO_ENP2B. The output driving unit 134 may include a data input unit 135, a pull-up driving unit 136, and a pull-down driving unit 137.

The data input unit 135 may perform a logical operation on the enable signal RGIO_ENP2B and the output of the node NODE2, and output the operation result. The data input unit 135 may include a plurality of inverters IV18 to IV20, a NAND gate ND3, and a NOR gate NOR3. The data input unit 135 may use the first supply voltage VDD2 having a high voltage level as a source voltage. Therefore, the data input unit 135 may supply a signal having the first supply voltage level VDD2 to the pull-up driving unit 136 and the pull-down driving unit 137.

The NAND gate ND3 may perform a NAND operation on the output of the node NODE2 and the enable signal RGIO_ENP2B inverted by the inverter IV18. The inverter IV19 may invert an output of the inverter IV18. The inverter IV20 may invert an output of the NAND gate ND3, and output the inverted signal to the pull-up driving unit 136. The NOR gate NOR3 may perform a NOR operation on the output of the node NODE2 and the output of the inverter IV19.

The pull-up driving unit 136 may include an NMOS transistor N9 for pulling up the GIO line GIO3 to the second supply voltage level VDDQ in response to the output of the inverter IV20. The NMOS transistor N9 may be coupled between the second supply voltage terminal VDDQ and the GIO line GIO3, and receive the output of the inverter IV20 through a gate terminal thereof. The NMOS transistor N9 may have a bulk terminal coupled to the GIO line GIO3.

The pull-down driving unit 137 may include an NMOS transistor N10 for pulling down the GIO line GIO3 to the ground voltage level in response to an output of the NOR gate NOR3. The NMOS transistor N10 may be coupled between the GIO line GIO3 and the ground voltage terminal, and receive the output of the NOR gate NOR3 through a gate terminal thereof. The NMOS transistor N10 may receive the ground voltage VSS through a bulk terminal thereof.

The NMOS transistors N3 and N7 installed in the repeaters 120 and 130 in accordance with an embodiment may use the second supply voltage VDDQ having a lower level than the first supply voltage VDD2, in order to reduce current consumption during a read or write operation. In order to use the second supply voltage VDDQ having a lower level, the NMOS transistors N3 and N7 having a low threshold voltage may be used.

As described above, the data transfer device 100 in accordance with an embodiment may reduce the amount of current consumed in the driving circuit for driving the GIO lines GIO1 to GIO3. In other words, although the source voltage of the input terminal has a level corresponding to the first supply voltage level VDD2, the second supply voltage VDDQ having a lower level than the first supply voltage VDD2 may be applied to the GIO lines GIO1 to GIO3, which may make it possible to reduce the current consumption.

In an embodiment, the pull-up driving elements of the pull-up driving units 112, 126, and 136 may be implemented with the NMOS transistors N1, N5, and N9 instead of PMOS transistors. Furthermore, the second supply voltage VDDQ having a lower level than the first supply voltage VDD2 may be used as the source voltages of the pull-up driving units 112, 121, 126, 131, and 136 and the latch units L1 and L3, which may make it possible to reduce the current consumption.

Figure 2:
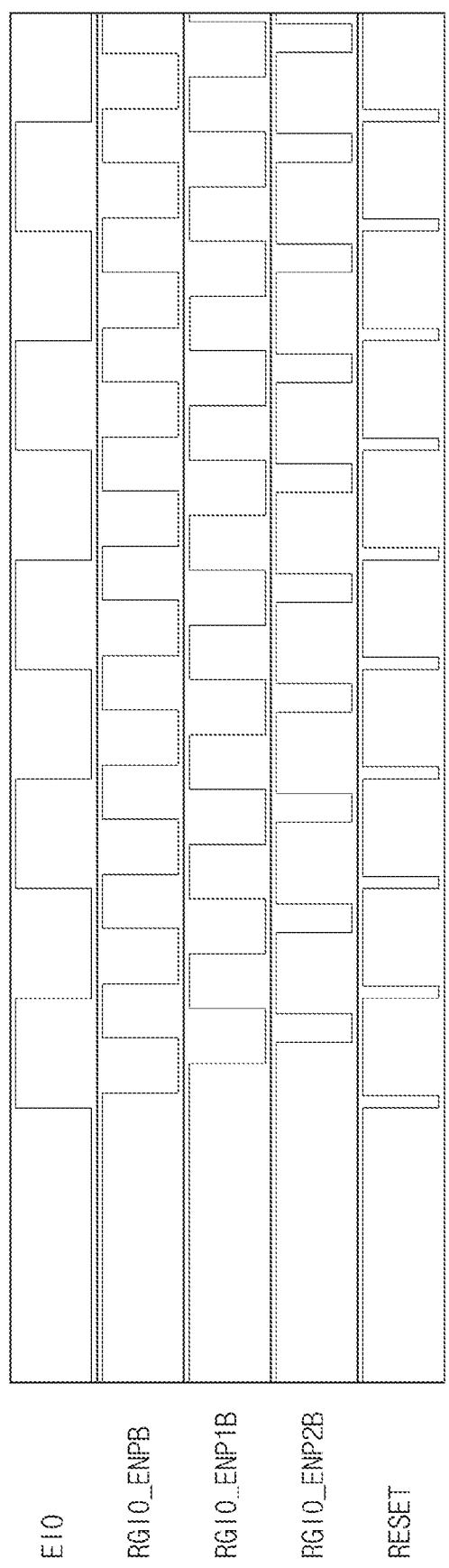
FIG. 2 is an operation waveform diagram of the data transfer device in accordance with an embodiment of FIG. 1.

FIG. 2 is an operation waveform diagram of the data transfer device in accordance with an embodiment of FIG. 1. Referring to the operation waveform diagram of FIG. 2, the operation process of FIG. 1 will be described in detail.

Suppose that the input data EIO is applied at a logic high level. The enable signal RGIO_ENPB may be activated to a logic low level. Then, according to a logical operation result of the data input unit 111, the pull-down driving unit 113 may be turned off, and the pull-up driving unit 112 may be turned on. Therefore, high-level data may be transferred to the GIO line GIO1.

The pull-up driving unit 112 may use the second supply voltage VDDQ having a low voltage level as a source voltage. Therefore, the high-level data transferred to the GIO line GIO1 may have the second supply voltage level VDDQ having a lower than the first supply voltage VDD2.

On the other hand, when the input data EIO is applied at a logic low level and the enable signal RGIO_ENPB is activated to a logic low level, the pull-down driving unit 113 may be turned on according to a logical operation result of the data input unit 111. Therefore, low-level data may be transferred to the GIO line GIO1.

Then, the latch unit L1 may latch the data of the GIO line GIO1 for a predetermined time. When a read or write operation is performed, the control signal RD_WT may be activated to turn off the pull-up driving unit 121. On the other hand, when a read or write operation is not performed, the control signal RD_WT may be deactivated to turn on the pull-up driving unit 121. Then, before a read or write operation is performed, the data transferred to the GIO line GIO1 may be pulled up to the second supply voltage level VDDQ.

When the GIO line GIO1 has a large length, the voltage level of a signal applied by the GIO driver 110 may be attenuated by line loading. Therefore, the pull-up driving unit 121 may precharge the data transferred to the GIO line GIO1 to the second supply voltage level VDDQ, thereby compensating for the attenuation in voltage level of the GIO line GIO1.

Before a read (or write) operation, the reset signal RESET may be activated to a low level to turn on the reset unit 123. That is, before the enable signal RGIO_ENP1B is activated to a low level, the reset unit 123 may be turned on to shift the voltage level of the node NODE1 to the first supply voltage level VDD2. The latch unit L2 may latch the voltage level of the node NODE1 for a predetermined time.

Then, when data applied to the GIO line GIO1 is at a logic high level, the NMOS transistor N3 of the data driving unit 122 may be turned on. Since the NMOS transistor N3 receives a signal of the second supply voltage VDDQ having a lower level than the first supply voltage VDD2 through the gate terminal thereof, current consumption may be reduced. At this time, since the enable signal RGIO_ENP1B is deactivated to a high level, the NMOS transistor N4 may be maintained in an off state.

Then, when the enable signal RGIO_ENPB is activated to a low level during a read (or write) operation, the reset signal RESET may transition to a high level. The enable signal RGIO_ENP1B may be activated to a low level at a predetermined time after the enable signal RGIO_ENPB was activated. The enable signal RGIO_ENPB may be activated to a low level during an operation of an input/output sense amplifier described later. The enable signal RGIO_ENP1B may be obtained by delaying the enable signal RGIO_ENPB by a predetermined time.

Then, the NMOS transistor N4 of the data driving unit 122 may be turned on to change the node NODE1 to a logic low level. Then, according to a logical operation result of the data input unit 125, the pull-down driving unit 127 may be turned on, and the pull-up driving unit 126 may be turned off. Therefore, low-level data may be transferred to the GIO line GIO2.

Then, the enable signal RGIO_ENP1B may transition to a high level to turn off the pull-down driving unit 127. Then, when the reset signal RESET transitions to a low level, the node NODE1 may be reset to a high level.

When the data applied to the GIO line GIO1 is at a logic low level, the NMOS transistor N3 of the data driving unit 122 may be turned off. When the enable signal RGIO_ENP1B transitions to a low level, the pull-up driving unit 126 may be turned on to transfer high-level data to the GIO line GIO2. When the enable signal RGIO_ENP1B is activated to a low level, the node NODE1 may be retained at a high level by the latch unit L2. At this time, since the pull-up driving unit 126 uses the second supply voltage VDDQ as a source voltage, the data transferred to the GIO line GIO2 may have the second supply voltage level VDDQ.

Then, the repeater 130 may drive the data applied to the GIO line GIO2 and output the driven data as output data DOUT to the GIO line GIO3, in response to the enable signal RGIO_ENP2B, The enable signal RGIO_ENP2B may be activated to a low level at a predetermined time after the enable signal RGIO_ENP1B was activated. Further-more, before the enable signal RGIO_ENP1B is deactivated to a high level, the enable signal RGIO_ENP2B may transition to a high level.

In this way, the repeater 130 may be operated to output the output data DOUT to the GIO line GIO3. In accordance with an embodiment of FIG. 2, the repeaters 120 and 130 may be driven and operated in the same manner. Therefore, the following descriptions will be focused on the operation of the repeater 120, and the detailed descriptions of the operation of the repeater 130 will be omitted herein.

In an embodiment, three GIO lines GIO1 to GIO3 may be installed, but the number of data lines is not limited thereto. Furthermore, in an embodiment, the GIO lines GIO1 to GIO3 may be driven by the second supply voltage VDDQ, but is not limited thereto. For instance, in an embodiment, the GIO lines GIO1 to GIO3 may be driven by a third supply voltage VDD2L having a higher level than the second supply voltage VDDQ and a lower level than the first supply voltage VDD2.

Figure 3:
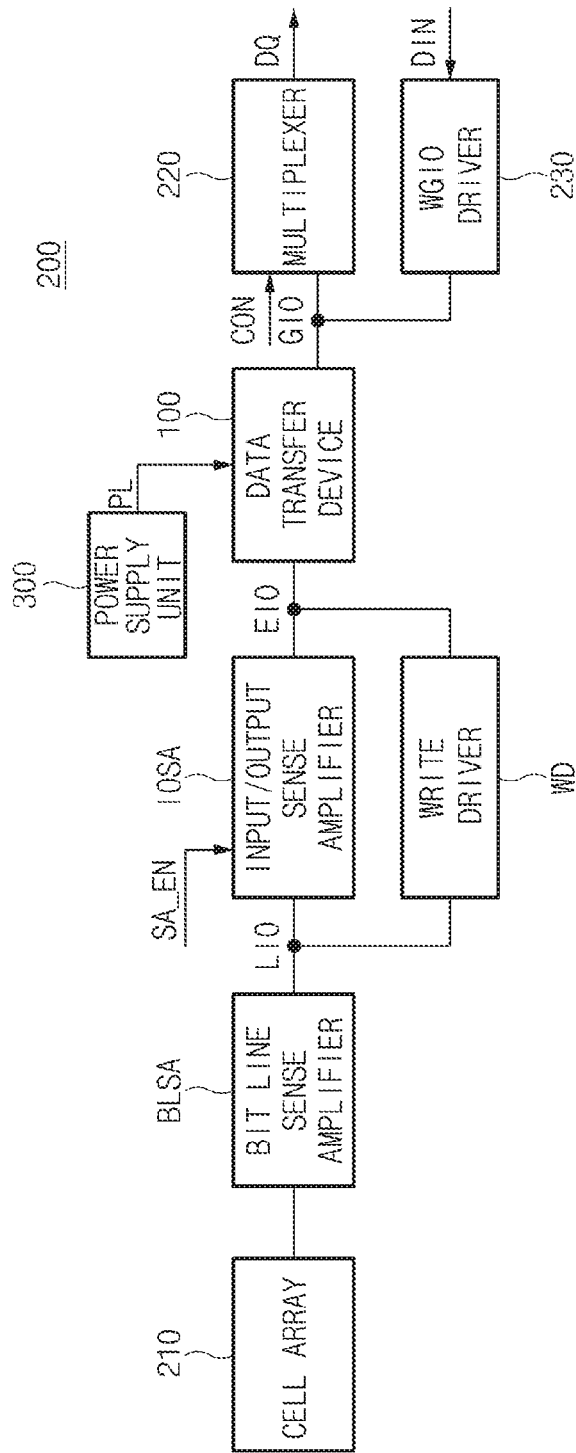
FIG. 3 is a configuration diagram illustrating a semiconductor device including a data transfer device in accordance with an embodiment.

FIG. 3 is a circuit diagram of a semiconductor device including the data transfer device in accordance with an embodiment.

The semiconductor device 200 including the data transfer device 100 in accordance with an embodiment of FIG. 3 may include a cell array 210, a bit line sense amplifier BLSA, an input/output sense amplifier IOSA, the data transfer device 100, a multiplexer 220, a write global input/output (WGIO) driver 230, a write driver WD, and a power supply unit 300.

The bit line sense amplifier BLSA may be coupled between the cell array 210 and a local input/output line LIO, and sense and amplify data applied from the cell array 210. The input/output sense amplifier IOSA may sense and amplify data loaded in the local input/output line LIO according to a sense amplifier enable signal SA_EN during a read operation.

The data transfer device 100 may drive a GIO line GIO to a level corresponding to an output signal of the input/output sense amplifier IOSA during a read operation. The data transfer device 100 may drive the GIO line GIO to a level corresponding to an input signal of the GIO line GIO during a write operation. The data transfer device 100 may be driven using a voltage supplied through a power line PL as a source voltage.

The data transfer device 100 may be implemented with the circuit of FIG. 1. In various embodiments of FIG. 1, the data transfer device 100 has been exemplified as a data read circuit. In other embodiments, however, the data transfer device 100 may be applied to a data write circuit.

The multiplexer 220 may select data loaded in the GIO line GIO according to a data output mode and output the selected data (DQ), in response to a multiplexing control signal CON during a read operation. The control signal CON may be generated by an internal clock synchronized with a column select signal YS and the sense amplifier enable signal SA_EN, and activated at a timing delayed by a predetermined time from the sense amplifier enable signal SA_EN.

The WGIO driver 230 may drive the GIO line GIO to a level corresponding to data inputted DIN according to the clock, during a write operation. The write driver WD may drive the local data line LIO to a level corresponding to an output signal of the data transfer device 100 during the write operation.

Figure 4:
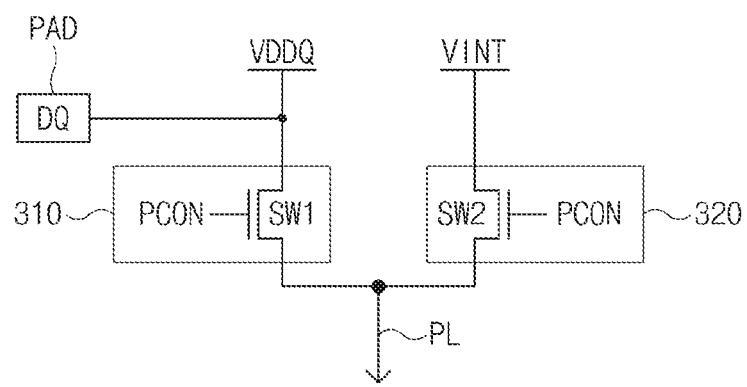
FIG. 4 is a detailed configuration diagram illustrating a power supply unit of FIG. 3 in accordance with an embodiment.

FIG. 4 is a detailed configuration diagram illustrating a power supply unit 300 for supplying power to the data transfer device 100 of FIG. 3.

The power supply unit 300 may include a plurality of power control units 310 and 320 for controlling a voltage applied to the power line PL. The power control unit 310 may include a switching element SW1 for selectively supplying the second supply voltage VDDQ to the power line PL in response to the power control signal PCON. The power control unit 320 may include a switching element SW2 for selectively supplying an internal supply voltage VINT to the power line PL in response to the power control signal PCON.

The power control signal PCON may be controlled by a mode register set (MRS) when a dynamic voltage frequency sequence (DVFS) for reducing power consumption is applied.

The data transfer device 100 applied to an embodiment of FIG. 1 and an embodiment of FIG. 3 may use the second supply voltage VDDQ as a source voltage for driving the GIO line GIO. The second supply voltage VDDQ may be set to an external supply voltage level used as a source voltage. In the semiconductor device, however, the level of the second supply voltage VDDQ may be changed in response to a frequency, depending on the specifications of the semiconductor device.

For example, in the specifications for the operation speed of the semiconductor device, the second supply voltage VDDQ (first level) may be used when the operation speed exceeds a preset specific frequency. However, when the operation speed is equal to or lower than the specific frequency, the level of the second supply voltage VDDQ may be lowered to a level lower than the first level. In this case, a sufficient voltage might not be supplied to the data transfer device 100 when the operation speed is equal to or lower than the specific frequency. Therefore, when the operation speed is equal to or lower than the specific frequency, the second supply voltage VDDQ might not be used, but the internal voltage VINT (second level) may be used.

That is, in the power supply unit 300 in accordance with an embodiment, the power control signal PCON may be set to the first logic level when the operation speed exceeds the specific frequency. Then, the power control unit 310 of the power supply unit 300 may be enabled to supply the second supply voltage VDDQ to the power line PL.

On the other hand, the power control signal PCON of the power supply unit 300 may be set to the second logic level when the operation speed is equal to or less than the specific frequency. Then, the power control unit 320 of the power supply unit 300 may be enabled to supply the internal supply voltage VINT to the power line PL. The internal supply voltage VINT may be set to a low drop output (LDO) voltage level.

When the switching element SW1 is positioned between the second supply voltage terminal VDDQ and the power line PL, it may be possible to prevent noise from flowing to a data (DQ) pad PAD at a high frequency. That is, when the switching element SW1 is turned off, the connection between the second supply voltage terminal VDDQ and the power line PL may be cut off, which may make it possible to prevent power noise from flowing to the DQ pad PAD.

Figure 5:
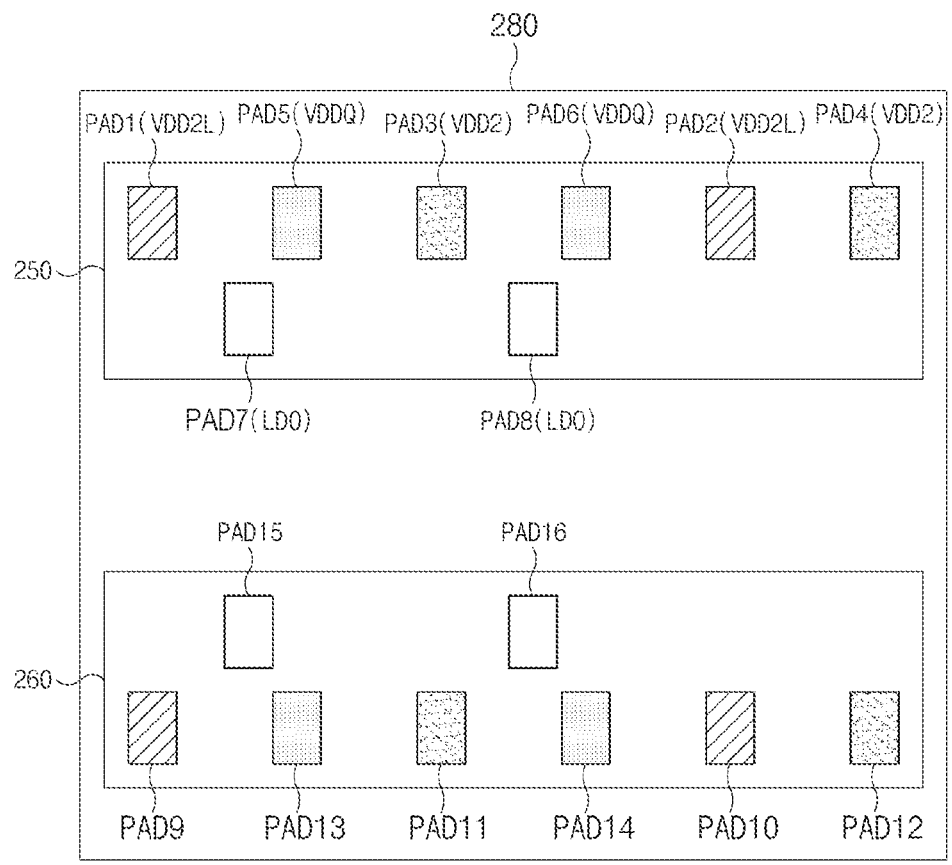
FIG. 5 illustrates a pad arrangement of the semiconductor device in accordance with an embodiment of FIG. 3.

FIG. 5 illustrates a pad arrangement 280 of the semiconductor device 200 in accordance with an embodiment of FIG. 3.

The semiconductor device 200 may include a pad arrangement 280 including pad units 250 and 260 for supplying a plurality of voltages. The pad units 250 and 260 may include a plurality of pads PAD1 to PAD16.

The pads PAD1 and PAD2 may receive the third supply voltage VDD2L. The pads PAD3 and PAD4 may receive the first supply voltage VDD2. The pads PAD5 and PAD6 may receive the second supply voltage VDDQ. The pads PAD7 and PAD8 may receive the LDO voltage. The pads PAD9 and PAD10 may receive the third supply voltage VDD2L. The pads PAD11 and PAD12 may receive the first supply voltage VDD2. The pads PAD13 and PAD14 may receive the second supply voltage VDDQ. The pads PAD15 and PAD16 may receive the LDO voltage.

In an embodiment, the pads PAD1 and PAD2 to which the third supply voltage VDD2L is applied and the pads PAD5 and PAD6 to which the second supply voltage VDDQ is applied may be arranged adjacent to the pads PAD7 and PAD8 to which the LDO voltage is applied. In this case, it may be possible to facilitate the design and implementation of the power supply unit 300 for controlling a voltage applied to the power line PL as illustrated in FIG. 4. In an embodiment, the pads PAD9 and PAD10 to which the third supply voltage VDD2L is applied and the pads PAD13 and PAD14 to which the second supply voltage VDDQ is applied may be arranged adjacent to the pads PAD15 and PAD16 to which the LDO voltage is applied. In this case, it may be possible to facilitate the design and implementation of the power supply unit 300 for controlling a voltage applied to the power line PL as illustrated in FIG. 4.

In accordance with various embodiments of the present disclosure, the data transfer device and the semiconductor device may reduce current consumption when transferring data.

While various embodiments have been described above, it will be understood to those skilled in the art that the embodiments described are examples only. Accordingly, the data transfer device described herein should not be limited based on the described embodiments.

What is claimed is:

1. A data transfer device comprising:
   a global input/output (GIO) driver configured for driving input data and outputting the driven data to a first GIO line, and configured for using a second supply voltage lower than a first supply voltage as a source voltage to drive the input data; and
   a repeater configured for amplifying data applied to the first GIO line, outputting the amplified data to a second GIO line, and shifting the data applied to the first GIO line to a level of the first supply voltage,
   wherein the repeater drives the data applied to the first GIO line to a first node, drives an output of the first node to the second GIO line, and resets the first node to the level of the first supply voltage based on a reset signal before a read operation,
   wherein the GIO driver drives the input data and outputs the driven data to the first GIO line based on a first enable signal,
   wherein the repeater drives the output of the first node to the second GIO line according to a second enable signal.

2. The data transfer device of claim 1,
   wherein the GIO driver comprises:
   a data input unit configured for performing a logical operation on the first enable signal and the input data;
   a pull-up driving unit configured for pulling up the first GIO line to a level of the second supply voltage based on a first output of the data input unit; and
   a pull-down driving unit configured for pulling down the first GIO line to a ground voltage level based on a second output of the data input unit.

3. The data transfer device of claim 2, wherein the data input unit is driven by the first supply voltage used as a source voltage.

4. The data transfer device of claim 2, wherein the pull-up driving unit comprises a n-channel metal-oxide semiconductor (NMOS) transistor which is coupled between the second supply voltage terminal and the first GIO line, and receives the first output of the data input unit through a gate terminal thereof.

5. The data transfer device of claim 1,
wherein the repeater comprises:
a first pull-up driving unit configured for pulling up the first GIO line to a level of the second supply voltage based on a control signal;
a first latch unit configured for latching the data applied to the first GIO line for a predetermined time;
a data driving unit configured for driving and shifting the data applied to the first GIO line, and outputting the shifted data to the first node; and
an output driving unit configured for driving the output of the first node and output the driven output of the first node to the second GIO line, based on the second enable signal.

6. The data transfer device of claim 5, wherein the first latch unit is driven by the second supply voltage used as a source voltage.

7. The data transfer device of claim 5, wherein the data driving unit comprises:
a first pull-down driving element configured for controlling the logic level of the first node according to a voltage of the first GIO line;
a second pull-down driving element coupled between the first pull-down driving element and a ground voltage terminal, and controlled by an inverted signal of the second enable signal;
a second latch unit configured for latching the data of the first node for a predetermined time; and
a reset unit configured for resetting the first node to the first supply voltage level based on a reset signal before the read operation.

8. The data transfer device of claim 7, wherein the first pull-down driving element comprises a n-channel metal-oxide semiconductor (NMOS) transistor which is coupled between the first node and the second pull-down driving element, and has a gate terminal coupled to the first GIO line.

9. The data transfer device of claim 7, wherein the second pull-down driving element comprises a n-channel metal-oxide semiconductor (NMOS) transistor which is coupled between the first pull-down driving element and a ground voltage terminal, and controlled by an inverted signal of the second enable signal through a gate terminal thereof.

10. The data transfer device of claim 7, wherein the second latch unit is driven by the first supply voltage used as a source voltage.

11. The data transfer device of claim 7, wherein the reset unit comprises a p-channel metal-oxide semiconductor (PMOS) transistor which is coupled between the first supply voltage terminal and the first node, and receives the reset signal through a gate terminal thereof.

12. The data transfer device of claim 7, wherein the reset signal transitions to a low level before the second enable signal is activated, and transitions to a high level at a point of time that the first enable signal is activated.

13. The data transfer device of claim 5, wherein the output driving unit comprises:
a data input unit configured for performing a logical operation on the second enable signal and the output of the first node, and being driven by the first supply voltage used as a source voltage;
a second pull-up driving unit configured for pulling up the second GIO line to the second supply voltage level based on a first output of the data input unit; and
a pull-down driving unit configured for pulling down the second GIO line to a ground voltage level based on a second output of the data input unit.

14. The data transfer device of claim 13, wherein the second pull-up driving unit comprises a n-channel metal-oxide semiconductor (NMOS) transistor which is coupled between the second supply voltage terminal and the second GIO line, and receives the first output of the data input unit through a gate terminal thereof.

15. The data transfer device of claim 14, wherein the NMOS transistor has a bulk terminal coupled to the second GIO line.

16. The data transfer device of claim 5, wherein the second enable signal is activated to a low level at a predetermined time after the first enable signal was activated.

17. A semiconductor device comprising:
an input/output sense amplifier configured for sensing and amplifying data of a local input/output line based on a sense amplifier enable signal during a read operation; and
a data transfer device configured for driving a second global input/output (GIO) line to a level corresponding to an output signal of the input/output sense amplifier during the read operation,
wherein the data transfer device comprises:
a GIO driver configured for driving input data using a second supply voltage lower than a first supply voltage as a source voltage, and outputting the driven data to a first GIO line based on a first enable signal; and
a repeater configured for shifting data applied to the first GIO line to a level of the first supply voltage,
wherein the repeater drives the data applied to the first GIO line to a first node, drives an output of the first node to the second GIO line according to a second enable signal, and resets the first node to the level of the first supply voltage based on a reset signal before the read operation.

18. The semiconductor device of claim 17, further comprising a power supply unit configured for supplying a voltage to a power line of the data transfer device,
wherein the power supply unit comprises:
a first power control unit configured for selectively supplying the second supply voltage to the power line based on a power control signal; and
a second power control unit configured for selectively supplying a low drop output (LDO) voltage to the power line based on the power control signal.

19. The semiconductor device of claim 18, wherein when an operation speed of the semiconductor device exceeds a preset specific frequency, the first power supply control unit is enabled to supply the second supply voltage to the power line, and when the operation speed is equal to or less than the specific frequency, the second power control unit is enabled to supply the LDO voltage to the power line.

20. The semiconductor device of claim 18, wherein a pad to which the second supply voltage is applied and a pad to which the LDO voltage is applied are arranged adjacent to each other.

* * * * *